United States Patent

Epstein et al.

[11] Patent Number: 5,970,086
[45] Date of Patent: Oct. 19, 1999

[54] RADIO REMOTE INTERFACE FOR MODULATING/DEMODULATING DATA IN A DIGITAL COMMUNICATION SYSTEM

[75] Inventors: Marvin A. Epstein, Monsey, N.Y.; Gary V. Blois, Towaco; Joseph M. Fine, West Caldwell, both of N.J.

[73] Assignee: ITT Manufacturing Enterprises, Wilmington, Del.

[21] Appl. No.: 08/861,606

[22] Filed: May 22, 1997

[51] Int. Cl.⁶ .............. H04B 1/38; H04J 3/04; H04L 12/403; H04Q 7/20

[52] U.S. Cl. .............. 375/219; 370/535; 370/455; 455/434

[58] Field of Search .............. 375/219; 455/434, 455/515, 560, 561; 370/535, 455, 465, 278, 281, 285, 293, 295

[56] References Cited

U.S. PATENT DOCUMENTS

| | | | |
|---|---|---|---|
| 5,199,031 | 3/1993 | Dahlin | 370/329 |
| 5,357,513 | 10/1994 | Kay et al. | 370/332 |
| 5,768,308 | 6/1998 | Pon et al. | 375/219 |
| 5,781,540 | 7/1998 | Malcolm et al. | 370/321 |

FOREIGN PATENT DOCUMENTS 22596  3/1993  United Kingdom .

*Primary Examiner*—Chi H. Pham
*Assistant Examiner*—Khai Tran
*Attorney, Agent, or Firm*—Arthur L. Plevy

[57] ABSTRACT

In a digital communications system for communicating between two radios by transceiving a signal comprising a first type control signal, a second type data traffic signal, and a third type voice signal, a remote communication interface for providing transmission therebetweeen comprising a duplexer bridge network for transceiving the signal, low pass filters, and analog to digital and digital to analog converters for processing received and transmitted signals respectively, and a digital signal processor for modulating and demodulating the signal for transmission or reception according to the signal type. A control signal output from the digital signal processor enables adjustment of the clock sampling frequency during the reception and demodulation process to obtain bit sync, bit tracking and frequency tracking. The communication interface is operable to transceive either the modulated traffic, control, or voice signal, or combined modulated traffic and control signal, or combined modulated voice and control signal.

33 Claims, 10 Drawing Sheets

CONTENTS (BA0 + m) = SIN ((43 * m)mod200 * P1/100)   DATA "0"

CONTENTS (BA0 + 200 -m) = SIN ((57 * m)mod200 * P1/100) DATA "1"

FIG. 3

3200HZ
(LOGIC 0)
REPEAT 5X
SIN (m X Pi/25) TABLE

| m | |
|---|---|
| 0 | SIN (0 * Pi/25) |
| 1 | SIN (1 * Pi/25) |
| 2 | SIN (2 * Pi/25) |
| ⋮ | ⋮ |
| 47 | SIN (197 * Pi/25) |
| 48 | SIN (198 * Pi/25) |
| 49 | SIN (199 * Pi/25) |

2560HZ
(LOGIC 1)
REPEAT 2X
SIN (4n x Pi/125) TABLE

| n | |
|---|---|
| 0 | SIN (0 * Pi/125) |
| 1 | SIN (4 * Pi/125) |
| 2 | SIN (8 * Pi/125) |
| ⋮ | ⋮ |
| 122 | SIN (488 * Pi/125) |
| 123 | SIN (492 * Pi/125) |
| 124 | SIN (496 * Pi/125) |

PROCESS:
SEQUENTIAL/REPEATED READS
m = m + 1
n = n + 1
NOTE: 250 SAMPLES/BIT

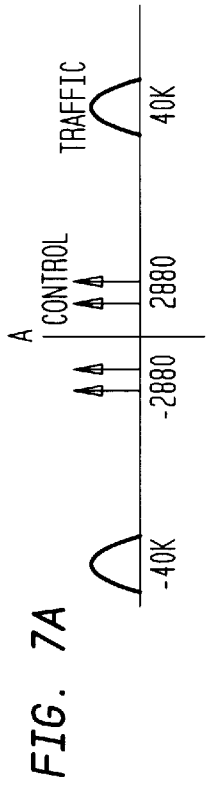
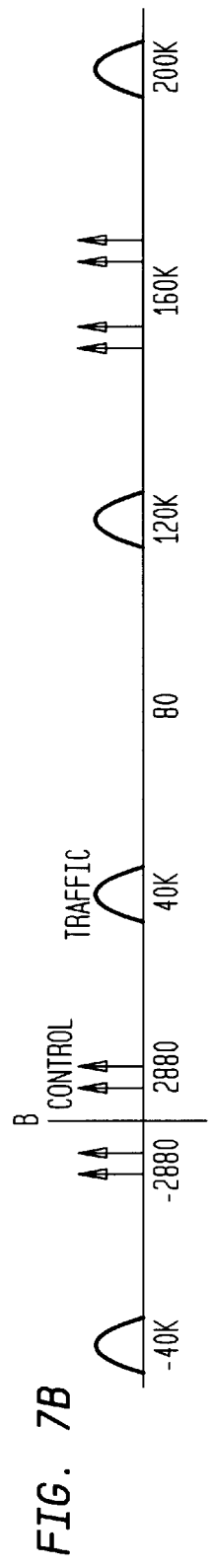
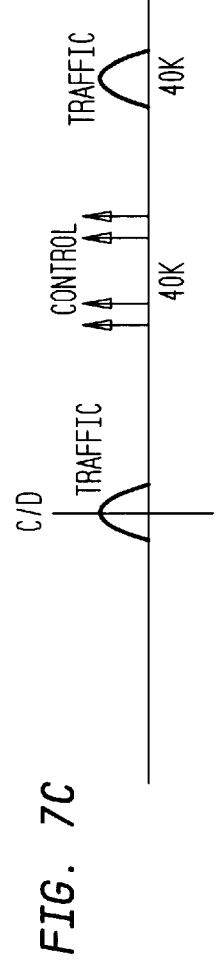
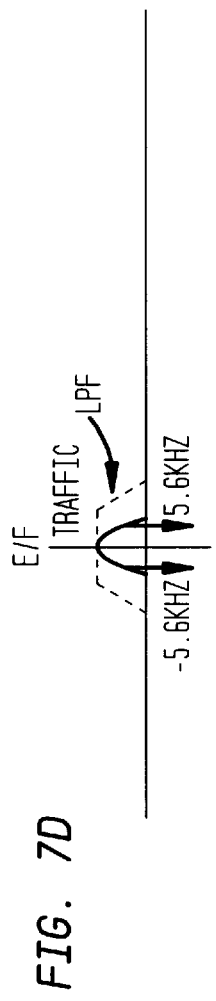
FIG. 7A
FIG. 7B
FIG. 7C
FIG. 7D

FIG. 9

2560HZ (LOGIC 1) REFERENCE TABLE
COS (m X 8 X Pi/25)
$I_1$

| m | |
|---|---|
| 0 | COS (0 X 8 X Pi/25) |
| 1 | COS (8 X Pi/25) |
| 2 | COS (16 X Pi/25) |
| ⋮ | ⋮ |
| 23 | COS (184 X Pi/25) |
| 24 | COS (192 X Pi/25) |

2560HZ (LOGIC 1) REFERENCE TABLE
SIN (m X 8 X Pi/25)
$Q_1$

| m | |
|---|---|
| 0 | SIN (0 X 8 X Pi/25) |
| 1 | SIN (8 X Pi/25) |
| 2 | SIN (16 X Pi/25) |
| ⋮ | ⋮ |
| 23 | SIN (184 X Pi/25) |
| 24 | SIN (192 X Pi/25) |

3200HZ (LOGIC 0) REFERENCE TABLE
COS (m X 10 X Pi/25)
$I_2$

| m | |
|---|---|
| 0 | COS (0 * Pi/125) |
| 1 | COS (10 * Pi/125) |
| 2 | COS (20 * Pi/125) |
| ⋮ | ⋮ |
| 23 | COS (230 * Pi/125) |
| 24 | COS (240 * Pi/125) |

3200HZ (LOGIC 0) REFERENCE TABLE
SIN (m X 10 X Pi/25)
$Q_2$

| m | |
|---|---|
| 0 | SIN (0 X 10 X Pi/125) |
| 1 | SIN (10 X Pi/125) |
| 2 | SIN (20 X Pi/125) |
| ⋮ | ⋮ |
| 23 | SIN (230 X Pi/125) |
| 24 | SIN (240 X Pi/125) |

RADIO REMOTE INTERFACE FOR MODULATING/DEMODULATING DATA IN A DIGITAL COMMUNICATION SYSTEM

FIELD OF THE INVENTION

The invention relates to digital communications systems, and more particularly, to modulating/demodulating control, traffic and voice signals via a radio remote interface in a digital communications system. A method for providing the same is also disclosed.

BACKGROUND OF THE INVENTION

Digital radios often have many modes for communicating with one another. For example, a user may speak into a receiver of a first digital radio, where that radio receives the voice signal, processes it, and transmits the information from an antenna out over the air at RF frequencies. The over the air RF waveform is then received by a second radio at its antenna, converted to baseband, and processed to recover the voice information transmitted by the first radio. Conversely, two digital radios may be arranged in a mode whereby the first radio transmits information to the second (remote) radio over a two wire interface rather than as an over the air waveform. For example, a cable line may be used to link two radios in such a manner as to permit communication over the two wire interface rather than through the conventional RF antenna arrangement. This type of interface permits the user of one digital radio to transmit information directly to a second digital radio, which may then retransmit or rebroadcast that information to a number of radios as an over the air waveform. This type of communication interface is particularly useful in a number of military and commercial applications where the first radio operator may desire to broadcast information to a number of other operators, but because of interference, terrain, or covert activity, cannot transmit an over the air signal. Instead, the first operator will transmit the information bearing signal over the two wire interface to a second radio remotely located from the first radio, who will receive the information and retransmit at its antenna as an RF signal. Similarly, RF signal information may be received by the first radio at its antenna, sent to a second remote radio over the two wire interface, received by the second radio, and retransmitted as an over the air waveform at its antenna. The SINGCARS digital radio is an example of a type of radio which employs these various modes of communication. Radios employing these techniques are shown in commonly assigned, copending U.S. patent application Ser. No. 08/864,885, filed on May 1, 1997 by Pries, et al., entitled "Method and Apparatus for Voice Intranet Repeater and Range Extension", Ser. No. 08/857,990, filed on May 16, 1997 by Bertrand, et al., entitled "Radio Architecture for an Advanced Digital Radio in a Digital Communication System", and Ser. No. 08/850,231, filed on May 2, 1997 by Epstein, et al., entitled "Frequency Hopping Synchronization and Tracking in a Digital Communication System". These radios are often frequency hopping signal transmission systems, which are a type of spread spectrum system in which the wideband signal is generated by hopping from one frequency to another over a large number of frequency choices. The frequencies used are chosen by a code similar to those used in direct sequence systems. For general background on spread spectrum systems, reference is made to a text entitled *Spread Spectrum Systems*, 2nd edition, by Robert C. Dixon and published by Wiley-Interscience, New York (1984). In order to increase the efficiency of digital radios employing spread spectrum characteristics, digital engineers have raised the number of modulation levels and have generally dealt with spectral shaping, synchronization schemes and modulation/demodulation techniques.

A problem arises in the two wire communication interface as to how to effectively transmit and receive the information between the two digital radios. In order to communicate the information, the information bearing signal must be modulated for transmission over the interface and then demodulated to recover the information. Although there are many modulation systems, quadrature modulation is widely used to modulate both the amplitude and the phase of a carrier signal. In quadrature modulation, an in-phase (I) component and a quadrature phase (Q) component of a carrier signal are modulated and transmitted along with the information bearing signal in order to communicate within a particular system. Mapping circuitry, frequency mixers and band limiting filters shape and condition the resulting waveform in order to demodulate the transmitted signal to obtain the information bearing signal portion.

In the past, engineers have realized modulators/demodulators using analog circuit techniques. However, these circuits often suffered from signal deviation problems resulting from analog signal drift. In recent years, attempts have been made to construct modulator/demodulator circuits using digital circuit technology. In a digital radio, many different signal types, including control signals, packet data signals, and analog voice signals, are required to be modulated, transmitted across a communication interface, received by a receiver radio, and demodulated such that the information bearing portion of the transmitted/received signals can be understood. Furthermore, each of the various types of signals may require various modulation/demodulation methods according to the inherent characteristics of the particular signal to be transmitted. Consequently, it is desirable to obtain an improved two wire communications interface for determining the type of signal to be transmitted/received and the digital modulation/demodulation scheme to be performed on that particular transceived signal.

SUMMARY OF THE INVENTION

It is an object of the present invention to provide in a digital communications system for communicating between two radios by transceiving a signal comprising a first type control signal, a second type data traffic signal and a third type voice signal, a two wire remote communication interface for providing transmission therebetween comprising: means for determining the signal type to be transmitted; means for modulating the signal for transmission according to the signal type; means for demodulating the signal for reception according to the signal type; wherein the communication interface is operable to transceive either the modulated traffic, control, or voice signal, or combined modulated traffic and control signal, or combined modulated voice and control signal.

BRIEF DESCRIPTION OF THE DRAWINGS

The invention is to be explained in more detail below based on an embodiment, depicted in the following figures where:

FIG. 3 is a diagram showing the 640 bps control signal modulation table implementation;

FIGS. 7A–D is a diagram useful in showing the 16 kbps demodulation spectrum vs. architecture points;

FIG. 9 is a diagram depicting the 640 bps control signal demodulation table implementation;

DETAILED DESCRIPTION OF THE INVENTION

Figure 1:
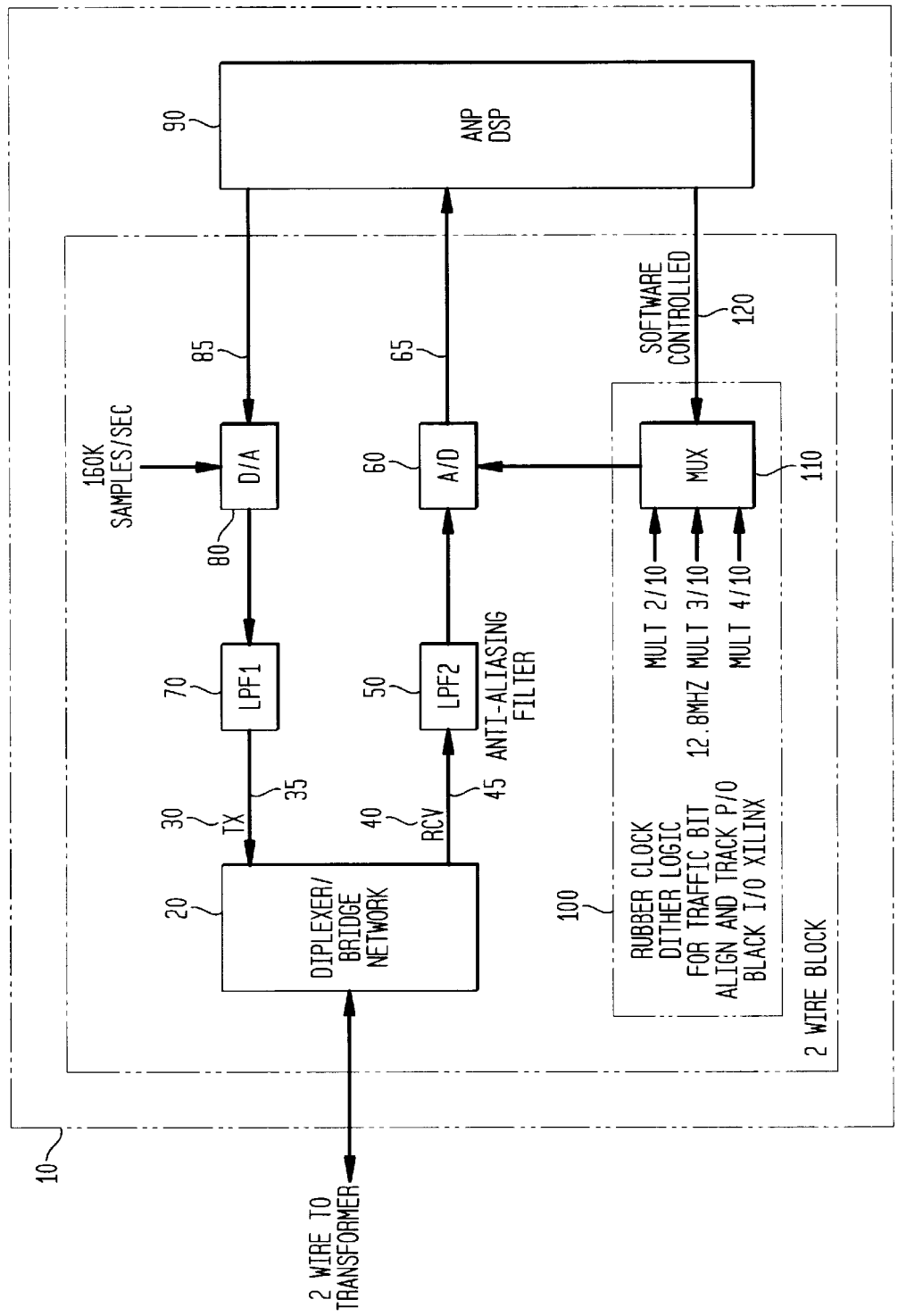
FIG. 1 is a functional block diagram of the two wire remote communication interface.

A functional block diagram of the two wire radio remote communication interface 10 for transmitting and receiving signals to and from a remote location is shown in FIG. 1. The hardware includes a duplexer/bridge network 20 (also called a duplexer) which sends a transmit signal 30 down line 35 and accepts a receive signal 40 and puts it on receive line 45. On receive line 45, a low pass anti-aliasing filter (LPF2) 50 is serially coupled to an analog to digital (A/D) converter to smooth out the received waveform and provide an anti-aliasing function for A/D conversion for input to digital signal processor (DSP) 90 over line 65. On transmit line 35, a digital to analog (D/A) converter 80 is serially coupled to low pass filter (LPF1) 70 to convert digital signals received from DSP 90 over line 85 to analog format and smooth out the D/A output for transmission to a remote location. In a preferred embodiment LPF1 70 is a 6 pole Butterworth filter having the following characteristics: Fc(3 dB)=64 KHZ with 29 dB down at 110 KHz. LPF2 is a 2 pole Butterworth filter having the following characteristics: Fc(3 dB)=60 Khz with 10 dB down at 110 Khz. Both A/D 60 and D/A 70 converters operate on a 160K sampling rate for handling 40 kHz carrier traffic signals. Also, the 160 kHz signal 95 can be advanced or retarded by one pulse of 3.84 MHz by changing the divide ratio for one 160 kHz pulse at multiplexer 110 in response to a software controlled signal over line 120 input to multiplexer 110. In this manner, a rubber clock is generated and locked to the sampling rate of the incoming bit clock to simplify the demodulation operation.

Two Wire Modulation

In a preferred embodiment, digital signals 35 and 45 transceived over the two wire communication interface 10 comprise control signals and traffic signals, which includes data traffic signals and FM voice signals. Control signals are sent as 640 bps data. Control signals are continuous phase frequency shift keyed (FSK) modulated on a 2880 Hz carrier. The control data signalling tones are sent at 2560 Hz (logic '1') and 3200 Hz (logic '0').

Traffic signals can be either a 16 kbps data signal or a single channel analog voice FM signal. The traffic data signals are FSK modulated on a 40 KHz carrier. The traffic data signals are sent at 45,600 Hz (logic '1') and 34,400 Hz (logic '0'). An FM voice signal is also modulated on the 40 KHz carrier. The control signal and either the traffic data (16 Kbps) or the FM voice signal are digitally summed in order to be able to transmit both signals concurrently using a single D/A converter.

Traffic Data Signal Modulation

Figure 2:
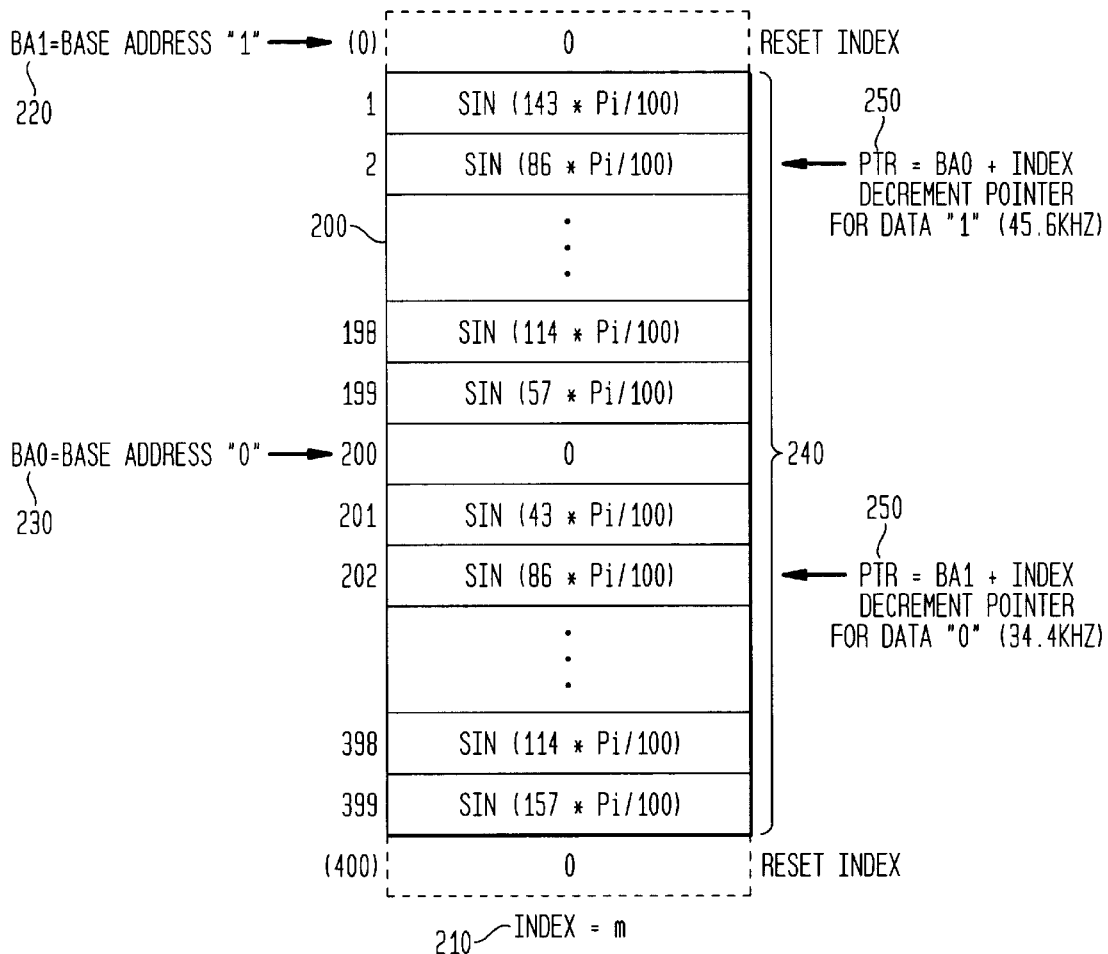
FIG. 2 is a diagram showing the 16 kbps data traffic signal modulation table implementation.

In the two wire interface hardware, a 160 KHz sampling rate is used for the A/D and D/A converters (reference numerals 60 and 80, respectively). In response to receiving a notification signal from an external source to begin traffic data signal modulation, DSP 90 accesses a lookup table in memory containing predetermined modulated traffic data samples and initiates retrieval of the data bits (logic '0' or '1') in the form of stored traffic data signal samples corresponding to the traffic data signal bits to be transmitted. As described above, traffic data signals are sent at 45,600 Hz (logic '1') and 34,400 Hz (logic '0') at a 16 kbps sample rate and modulated on a 40 Khz carrier. Therefore, for 16 kbps traffic data, a 160 KHz sampling frequency (4*40 KHz carrier) results in 10 samples per traffic data bit and/or 250 samples per control bit. At a signal frequency F and sampling rate R, the phase accumulation per sample is 360°*F/R. For the 40 KHz carrier, each sample represents a 90° phase accumulation. The phase accumulation for a traffic data bit (10 samples) is 1026° for the 45.6 KHz signal (logic '1') and 774° for the 34.4 KHz signal (logic '0'). Relative to the 40 KHz carrier (900° for 10 samples) therefore, for the single traffic data bit, a 45.6 KHz signal is advanced in phase by 126° and a 34.4 KHz signal is delayed by 126°. For traffic data signal modulation, the phase per sample of the 45.6 KHz and the 34.4 KHz signals are 360°*(57/200) and 360°*(43/200) respectively. Note that 45,600/160,000=(57/200) and 34,400/160,000=(43/200). These relationships are embedded in the table driven implementation 200 illustrated in FIG. 2. The traffic data signal modulation implementation 200 consists of a single index 210, two base addresses 220 and 230, and a size 399 table 240. The base address 220 for a data bit '1' (BA1) is 0, while the base address 230 for a data bit '0' (BA0) is 200. Lookup table 240 includes a pointer 250 having a pointer value for data bit '0'=BA0+index, while the pointer value for data bit '1'=BA1+index. The initial index value is 0.

Each traffic data bit consists of 10 samples that are read out from table 240. For samples in data '0' the processor steps 'down' through the higher address half of the table; i.e. the pointer value 250 increases for addresses 200–399. For samples in data '1', the pointer value steps 'up' through the lower address half of the table; i.e. the pointer value decreases for addresses 200–1. The values pointed to in the table are output to D/A converter 80 as illustrated in FIG. 1 for conversion to analog format, low pass filtered by LPF1 70, and transmitted to a remote radio (not shown). At the end of a data bit (i.e. after 10 samples), the last index value 210 is retained for use by the next traffic data bit to preserve phase continuity. Note that, at the end of a traffic data bit, the index is a multiple of 10.

The pointer value 250 of lookup table 240 is determined by adding an index value to the base address of the current bit (i.e. BA0 or BA1). The contents of the address pointed to by the pointer value within the lookup table is then retrieved. The 10 samples for a data '0' are output by writing out the table value pointed to, then incrementing the index and, therefore the pointer. The 10 samples for a data '1' are output by writing out the table value pointed to, then decrementing the index and, thus, the pointer. When the retained index value following transmission of a bit equals 0, the index is reset to 200 prior to transmitting a data '1'. When the retained index value equals 200, the index is reset to 0 prior to transmitting a data '0'. This keeps pointer 250 in lookup table 240.

The table values are stored as follows for index m:

Data '0': CONTENTS(BA0+m)=SIN([43*m] mod200*pi/100)

Data '1': CONTENTS(BA1+200-m)=SIN([57*m] mod200*pi/100.

For traffic data signals, the basic modulation operations comprise a pointer increment/decrement, a table write to output (per sample), an index addition, and pointer value calculation (Base Address±Index) per 10 samples. There is also an index reset every 200 samples. The per sample number of operations is thus: overhead+−3 cycles. The overhead is estimated at 10 cycles per sample. Accordingly, the loading for traffic data signal modulation is estimated at 160,000*(10+4)=2.2 Mips.

Control Data Modulation

In response to receiving a notification signal from an external source to begin control signal modulation, DSP 90 accesses lookup tables 1 and 2 illustrated in FIG. 3 containing predetermined modulated control data samples and initiates retrieval of the data bits (logic '0' or '1') in the form of stored control data signal samples corresponding to the control signal bits to be transmitted. During a control data bit period (1/640 second), the 2560 Hz (logic '1') and 3200 Hz (logic '0') control signals complete 4 or 5 cycles respectively. The control data bit period is 25 times longer than a traffic data bit period. Since there are 10 samples per traffic bit at a sampling frequency of 160 KHz, there are a total of 250 samples per control bit. Accordingly, two tables of size 250, one for each frequency, can be stored as templates for signal modulation. However, because the 3200 Hz signal completes 5 full cycles during a control bit period, table 1 could be reduced further to 50 values and repeated accessed for 5 cycles. A 2560 Hz table of 250 samples represents 4 full cycles. Therefore, table 2 can be reduced to 125 samples (representing two full cycles) and then repeated twice. FIG. 3 illustrates the table driven control modulation implementation for 640 bps control modulation. The table values are stored as follows for indices m and n:

Data '0': CONTENTS(m)=SIN(m*pi/25)

Data '1': CONTENTS(n)=SIN(4n*pi/125).

The control and traffic data modulation signals may be summed and output via a single D/A converter 80 as illustrated in FIG. 1 for conversion to analog format since both signals have been generated at the same sampling frequency. As shown in FIG. 1, the resultant modulated signal is low pass filtered by LPF1 70, and transmitted to a remote radio (not shown).

For control signal modulation, the basic modulation operations include an increment and a table write to output. The per sample number of operations is thus: overhead+−2 cycles). The estimated loading for Control Modulation is 160,000*(10+3) or 2.1 Mips. When control and data signals are sent simultaneously, the overhead is common to both processes, but there is included an additional summation. Simultaneous control and traffic loading is approximately (10+4+4)=18 cycles/sample*160,000 samples/sec or 2.9 Mips.

FM Voice Signal Modulation

Figure 4:
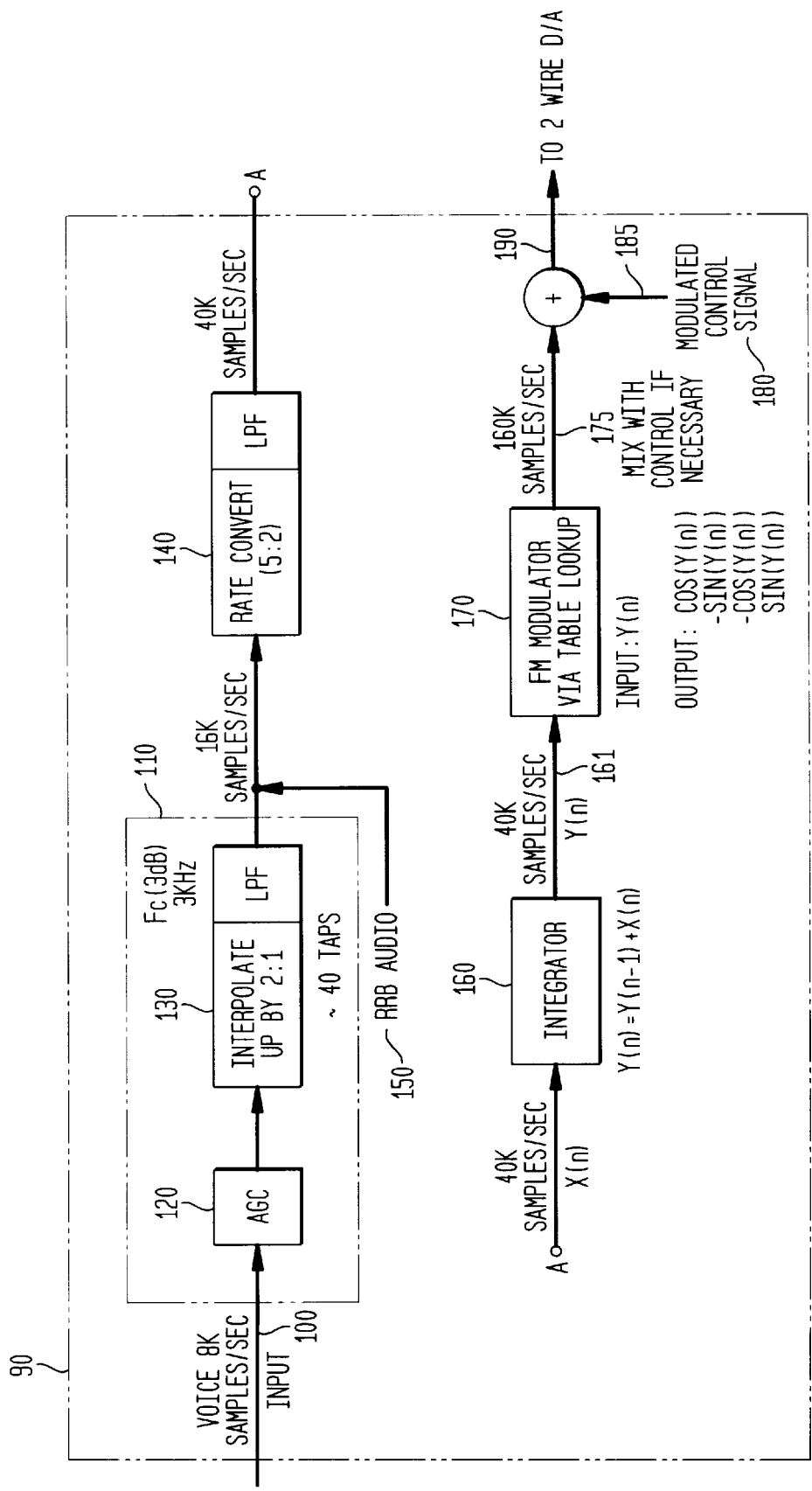
FIG. 4 is a block diagram showing the FM voice signal modulation implementation.

FIG. 4 illustrates a preferred embodiment of the FM voice signal modulation method. Digitized voice samples at an 8 KHz rate are input to DSP 90 over serial link 100 and interpolated to a rate of 40 KHz in two filter stages. The first audio filter stage 110 conditions the voice signal using acoustic gain control (AGC) 120 and interpolates the sampling rate from 8 to 16 KHz using a 34 tap low-pass finite impulse response (FIR) filter 130. The second filter stage interpolates the 16 KHz voice signal to a rate of 40 KHz using a 30 tap low-pass FIR filter 140.

At a 16 KHz sample rate, the two wire interface also accepts an input audio signal from a Retransmit (RXMT) or Remote Rebroadcast (RRB) source 150. This is audio received by one remote terminal radio over the air and which is retransmitted by a second remote terminal. Audio from source 150 is at 16 KHz and therefore does not pass through the first audio interpolation filter. Audio at 16 KHz from either the first stage interpolation filter 110 or source 150 is processed by the second audio interpolation filter 140. The resultant 40 KHz voice signal {x(n)} at node A is fed into integrator 160 and integrated by continually summing samples. The discrete-time integrator 160 is a single pole IIR filter defined by the following equation:

$$y(n)=y(n-1)+x(n).$$

The output signal, y(n), output over line 161 represents a phase angle scaled (mod 2 $\pi$) to an index and is input to a combined sine/cosine modulator table 170. The table 170 output modulates and interpolates the 40 KHz signal to a 160 KHz signal.

For each sample y(n), table modulator 170 outputs the 4 sample sequence:

$$\{\cos[y(n)],-\sin[y(n)],-\cos[y(n)], \sin[y(n)]\}$$

For each input sample at 40 KHz, the modulator requires two lookups from the combined sine/cosine table and generates four output samples. The resultant output signal rate is therefore four times the input rate or 160 KHz. In the preferred, the combined sine/cosine table 170 has 320 entries. An index to the sine table varies from 0 to 255, while an index to the cosine table varies from 64 to 319. The index is obtained from the phase angle by truncating the phase to 8 bits (modulo 2 $\pi$). The table look-up modulator 170 assumes that one sample at 160 KHz represents a 90° phase shift of the 40 KHz carrier.

$$\cos(\omega_c n+y)=\cos(\omega_c n)\cos(y)-\sin(\omega_c n)\sin(y)=\cos(y)$$

$$\cos(\omega_c(n+1)+y)=\cos(\omega_c n+90)\cos(y)-\sin(\omega_c n+90)\sin(y)=\sin(y)$$

$$\cos(\omega_c(n+2)+y)=\cos(\omega_c n+180)\cos(y)-\sin(\omega_c n+180)\sin(y)=\cos(y)$$

$$\cos(\omega_c(n+3)+y)=\cos(\omega_c n+270)\cos(y)-\sin(\omega_c n+270)\sin(y)=\sin(y)$$

where $\cos(\omega_c(n+j))$ and $\sin\omega_c n+j))$ terms are of the following form:

$$\cos(\omega_c n)=\{1,0,-1,0,\ldots\}$$

$$\sin(\omega_c n)=\{0,1,0,-1,\ldots\}$$

If modulated control signal data 180 is transmitted concurrently with voice signal data, the control data over line 185 is summed with the voice signal over line 175, output over line 190 and written to the output D/A converter 80, since both signals have been generated at the same sampling frequency, for transmission over the interface.

The estimated loading for FM voice signal modulation is 10 cycles of overhead, 34 taps at 8 KHz for the first audio interpolation filter 130 (two 17-tap phases at 16 KHz), 15 taps at 16 KHz, 4 cycles at 40 KHz for integrator 160, and 10 cycles at 40 KHz for the phase scaling and table look-up modulator 170. The filter loadings assume the total number of cycles is approximately the number of taps plus one: 160000*(10+35/20+16/10+4/4+10/4)=2.7 Mips.

Two Wire Demodulation

On the two-wire interface 10 illustrated in FIG. 1, control signal data (640 bps) and traffic signal data (16 kbps), or control signal data and FM voice signal data may be transmitted simultaneously. Accordingly, there may exist up to two concurrent demodulation processes.

In the preferred embodiment of the two wire interface demodulation design, control signal demodulation is always active in the absence of control data transmission. Demodulated control signal data results in several control word message types. A control message tells the remote transmitter which of the 40 KHz demodulation processes is to take place. However, there is no message from the remote radio transmitter to the receiving control unit to notify whether one is receiving voice or data. The two wire interface, therefore, must be able to distinguish between voice and data. The demodulation design attempts to find traffic data first, and, failing to detect data, switches to voice demodulation.

Traffic Data Signal Demodulation

Figure 5:
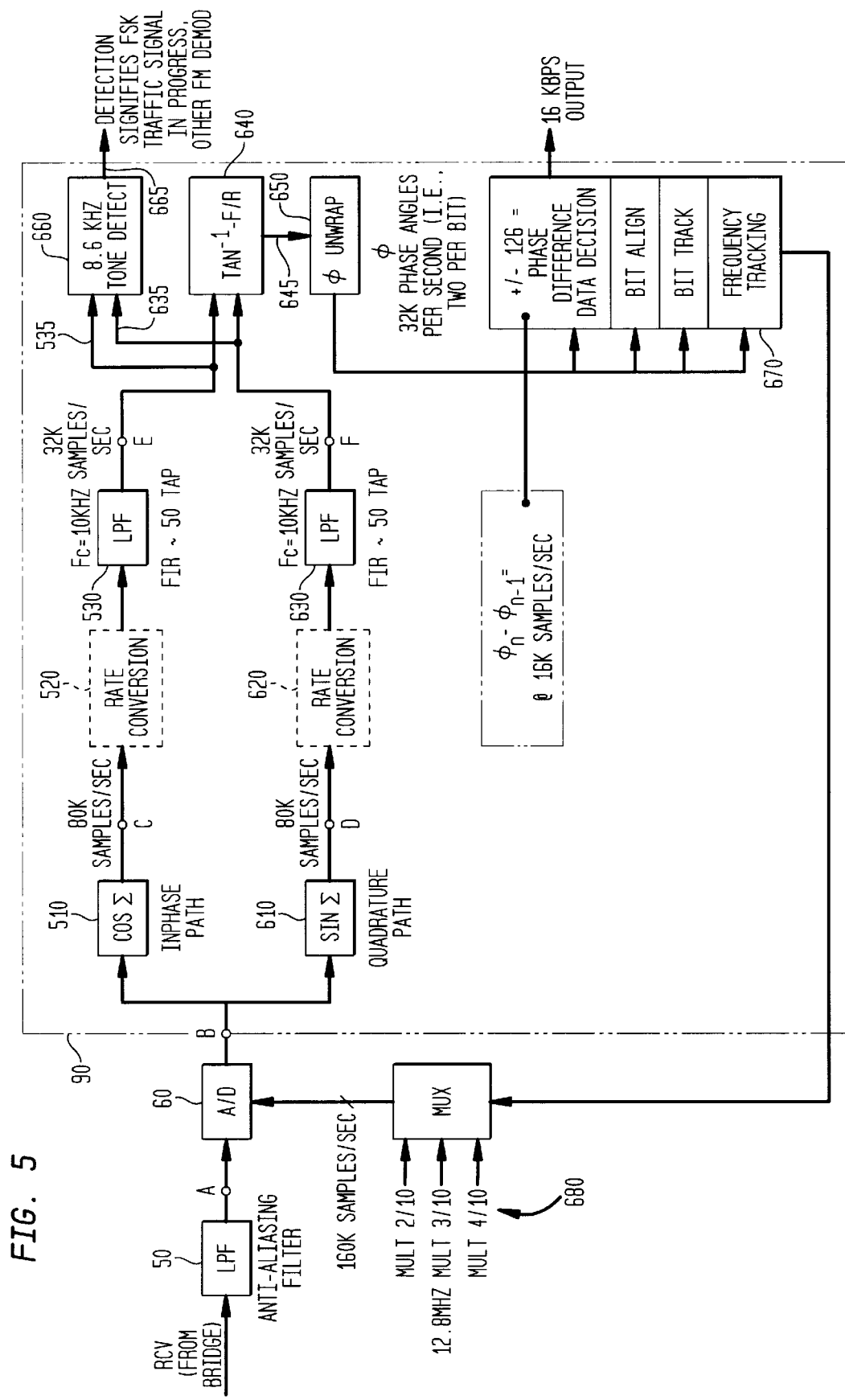
FIG. 5 is a diagram showing the 16 kbps data traffic signal demodulation process.
Figure 6:
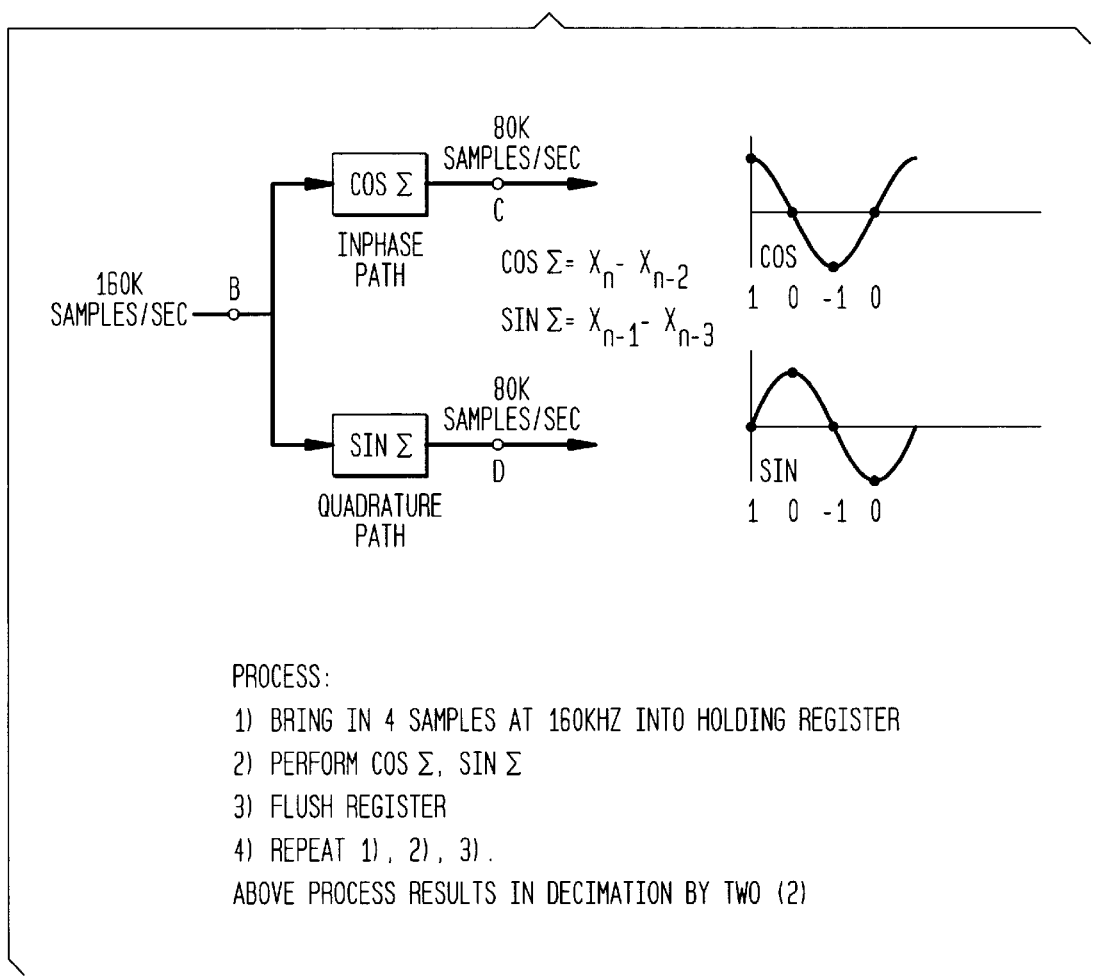
FIG. 6 illustrates the quadrature and in phase component processing for the 16 kbps data traffic signal demodulation process.

FIG. 5 illustrates the traffic data signal demodulation process of the two wire interface. In the preferred embodiment, digitized samples are provided to DSP 90 via a common hardware low pass anti-aliasing filter 50 and an A/D converter network 60. The spectral characteristics of the signal after low pass filter 50 is illustrated in FIG. 7A, while FIG. 7B shows the signal spectrum after A/D converter network 60. As shown in FIG. 1, this hardware network is common to all DSP demodulation processes (i.e., 16 KBPS FSK Traffic, 640 BPS FSK Control, and voice mode). In FIG. 5, A/D samples are supplied to the DSP at node B at a nominal rate of 160K samples/sec, or four times the 40 KHz traffic carrier. External to DSP 90 is a sampling clock dither network which skews the A/D sampling clock to permit initial 16 KBPS traffic bit alignment and to maintain bit synchronization (i.e., bit tracking). The 160K samples/sec traffic data signal is split into two signals; module 510 receives the 160K samples/sec traffic data signal at node B and outputs a first signal at node C representing the inphase (I) component; module 610 receives the 160K samples/sec traffic data signal at node B and outputs a second signal at node D representing the quadrature (Q) channel component. In the preferred embodiment, four data samples are moved into a holding register in DSP 90, multiplied by a 40 KHz cosine signal at module 510 and a 40 KHz sine signal at module 610 (i.e., 1,0,-1,0 or 0,1,0,-1) and summed, with the output decimated by 2. The register is then flushed, and the process is repeated for the next four traffic signal data samples. This is implemented as two differencing operations as illustrated in FIG. 6 and given by:

$$I(n)=x(n)-x(n-2);$$

$$Q(n)=x(n-1)-x(n-3).$$

The result is that both I and Q components are band shifted to DC with an output rate of 80 KS/sec. FIG. 7C shows the 16 Kbps traffic data signal spectrum characteristics at this point. (Note: pseudo test points placed at each stage in FIG. 5 correspond to the spectra shown in FIGS. 7A–D.) Following the "COS SUM" 510 and "SIN SUM" 610 filters, rate converters 520 and 530 operate on I and Q signals to band shift the traffic data signal spectrum to dc as illustrated in FIG. 7D (refer to test points E/F in the illustrations). In addition, the control energy has been shifted to 40 KHz. The 80 KHz inphase and quadrature signals are reduced to 32 KHz signals. Fifty tap low pass FIR filters 530 and 630 having a 10 KHz bandwidth operate on the rate converted I and Q signals to remove any remaining control energy. Following the LPF stage, the 32 KHz I and Q signals are input to ARCTANGENT module 640. The arctangent function operates on the I and Q signals and is computed 32,000 times/sec resulting in two phase angles per bit at 16 kbps.

The arctangent output is limited to the range of (-pi,pi). Therefore the phase signal output from module 640 is input over line 645 to phase module 650 in order to "unwrap" the phase angle, since the total phase can be many multiples of pi. Following phase unwrapping, the I and Q signal components are input over lines 535 and 635 to tone detection module 660 to determine if a traffic data signal is being received. During receipt of the phasing signal in a data message, the output of the arctangent clock has a predominantly 8 KHz tone. (This module does not detect a steady tone run-up signal.) In the absence of detection of a data tone after an appropriate interval, a determination is made that voice signal data is present; FM voice demodulation is then initiated over line 665. Tone detection, however, signifies that a traffic data signal is received. Therefore, traffic data detection, bit alignment, bit tracking and frequency tracking at module 670 is initiated. The process of performing the phase difference data decision is to subtract every other phase angle to derive an alignment signal. As an example, the data sequence [1 0 1 0] results in the phase signal:

$$(x) \ldots [x+63, x+126, x+63, x, x+63, x+126, x+63, x]$$

where x is the previous phase and 63°=360°*(5.6 KHz/32 KHz).

Differencing every other phase results in the alignment sequence:

$$[126, 0, -126, 0, 126, 0, -126];$$

The errors in the alignment signal are used to determine which direction to slew sampling clock 680. For example, during reception of the phasing signal (101010 . . . ), the sampling clock 680 is adjusted to drive even phase differences in the alignment signal to 0 and odd phase differences to ±126° (or vice versa). It is easier to discern the zeroes than the peaks of the alignment signal. Therefore, the algorithm for bit sync, bit tracking and frequency tracking attempts to maintain the odd (or even) phase differences at or near zero. The alternate phase differences represent the data (+126 represents a data '1' and -126 represents a data '0') portions of the demodulated signal.

An estimate has been made of computational loading for 16 kbps traffic demodulation. Assuming 10 cycles for each interrupt, 8 cycles each for the COS SUM and SIN SUM demodulation operations, 35 cycles for each of the 10 KHz low pass filters, 70 cycles for an arctangent at 32 KS/sec), and 45 cycles for phase unwrapping. Allowing 50 cycles for the combination of bit decision, bit alignment, bit tracking and frequency tracking, the peak computational load is:

160,000*(10+8*2/2+35*2/10+115/5 +50/5)=9.3 Mips.

640 bps Control Demodulation

Figure 8:
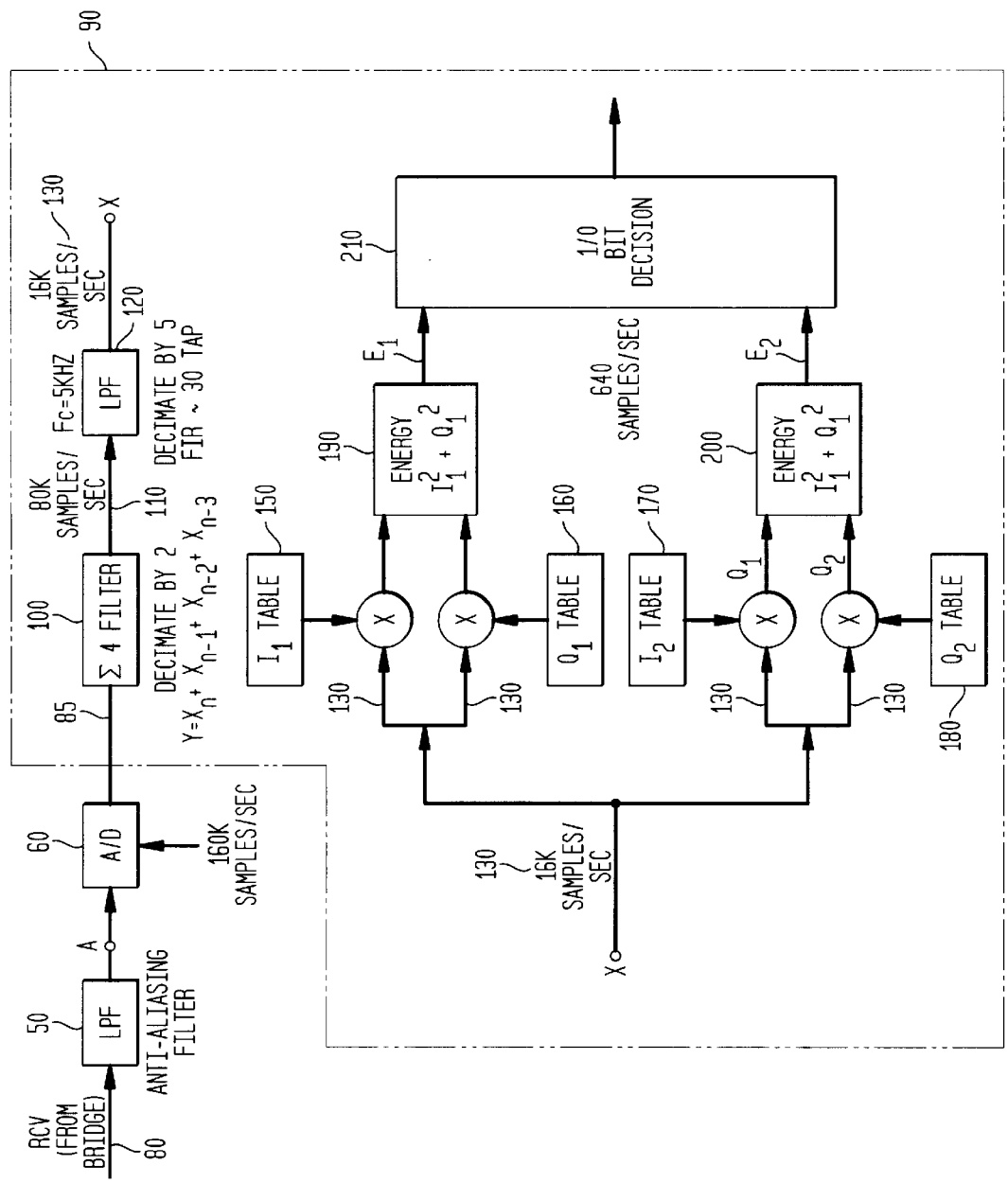
FIG. 8 is a diagram showing the 640 bps control signal demodulation process.

In the time domain, the control data signal 80, which may arrive mixed with traffic data, is first filtered, sampled at 160 KHz and digitized, as shown in FIG. 8 reference numerals 50 and 60. The digitized signal 85 is routed to both the traffic and control demodulators. The control demodulator 90 shown in FIG. 8 must attenuate traffic signal energy. This takes place in two stages. In the initial filtering, a simple summing filter 100 takes in four samples, adds them and outputs the sum. The output is decimated by 2. This reduces the sampling rate in half to 80 KHz and also partially filters out traffic signal energy. The summing filter 100 cancels 40 KHz and 80 KHz energy and attenuates spectral energy close to 40 (and 80) KHz. Traffic energy is not entirely filtered out, however. The attenuation at 34.4 KHz and 45.6 KHz is -8.0 dB and -11.3 dB respectively. The resultant signal 110 at an 80 KHz sampling rate is then input to low-pass filter 120 to attenuate the remaining traffic energy. This filter has a cutoff frequency of 5 KHz and is decimated to a sample rate of 16 KS/sec. The control data low-pass FIR filter 120 (30 taps) attenuates traffic energy by 30 dB.

At a 16 KHz sampling frequency, there are 25 samples per control bit (i.e. (1/640)=25*(1/16000)). The 2560 Hz and the 3200 Hz control signals complete 4 and 5 full cycles during a control data bit respectively. In the preferred embodiment the demodulation process requires the correlation of 25 samples of received data with 25 samples of stored references. As shown in FIGS. 8 and 9, four reference tables of 25 samples each comprise the reference samples to be correlated against the received control data samples: an In-phase reference table for 2560 Hz (reference numeral 150); In-phase reference table for 3200 Hz (I2 reference numeral 170); Quadrature reference table for 2560 Hz (Q1 reference numeral 160); and Quadrature reference table for 3200 Hz (Q2 reference numeral 180). The 3200 Hz signal completes 5 full cycles in 25 samples (10 $\pi$ radians). Therefore, the I and Q channel reference table consists of 25 values of $\cos(m*\pi*10/25)$ and $\sin(m*\pi*10/25)$ as illustrated in FIG. 9. These tables actually consist of the same 5 values repeated 5 times. The references for 2560 Hz also consist of 25 values. The 2560 Hz signal goes through 4 cycles (8 $\pi$ radians) in 25 samples, so these tables consist of the values $\sin(m*\pi*8/25)$ and $\cos(m*\pi*8/25)$. ($0 \leq m \leq 24$). Each of the correlations is implemented as a 25-tap filter. The filter coefficients are read from the four tables previously defines. At the end of the computation, a new set of 25 data samples are brought in. (This is an integrate-and-dump or a decimate by 25.)

Four correlations with the above-identified reference tables are performed against received signal samples 130 to produce output signals I1, Q1, representing a 2560 Hz channel and I2 and Q2 representative of a 3200 Hz channel. Signals I2 and Q1 are then input to module 190 while signals I2 and Q2 are input to module 200 in order to compute the energy levels of the combined signals according to the following formula:

$$E1=E(2560)=I^2(2560)+Q^2(2560)=I1^2+Q1^2 \quad 1)$$

$$E2=E(3200)=I^2(3200)+Q^2(3200)=I2^2+Q2^2 \quad 2)$$

The energy output signals E1 and E2 of modules 190 and 200 are then input to bit decision module 210 and compared against one another to determine which is greater. The energy signal having the greater value is determined to be representative of the received bit value (e.g. for E1>E2, data bit '1' is detected). One should note that many variations for performing bit decision processing are available and intended to be within the scope of the invention. For example, an alternate data detection process is to determine which of the four correlated signals values (I1, I2, Q1, Q2) has the largest magnitude.

For initial bit alignment, the reference correlations are performed five times per control data bit. That is, 25 samples (at the 16 Kbps rate) are correlated with each of the four references, but instead of dumping the data, the five oldest samples are discarded and five new samples are received. This is a decimate by 5 rather than a decimate by 25. In this method five energy calculations per bit are provided. Initial control alignment is based on seeing where the preamble to data start bit transition occurs. The computational load for the bit alignment is relatively small because much of the computation is redundant.

An estimate has been made of the computational load for the 640 bps control demodulation. Assuming that there are no extra cycles needed for the interrupt because they were used for the traffic demodulation, the low pass filter 50 takes 8 cycles, the 5 KHz FIR filter 120 (30 taps) takes 40 cycles and the correlation, bit decision, and bit tracking take 250 cycles. The computational load is: 160,000*(8/2+40/10+250/250)=1.4 Mips.

FM Demodulation

Figure 10:
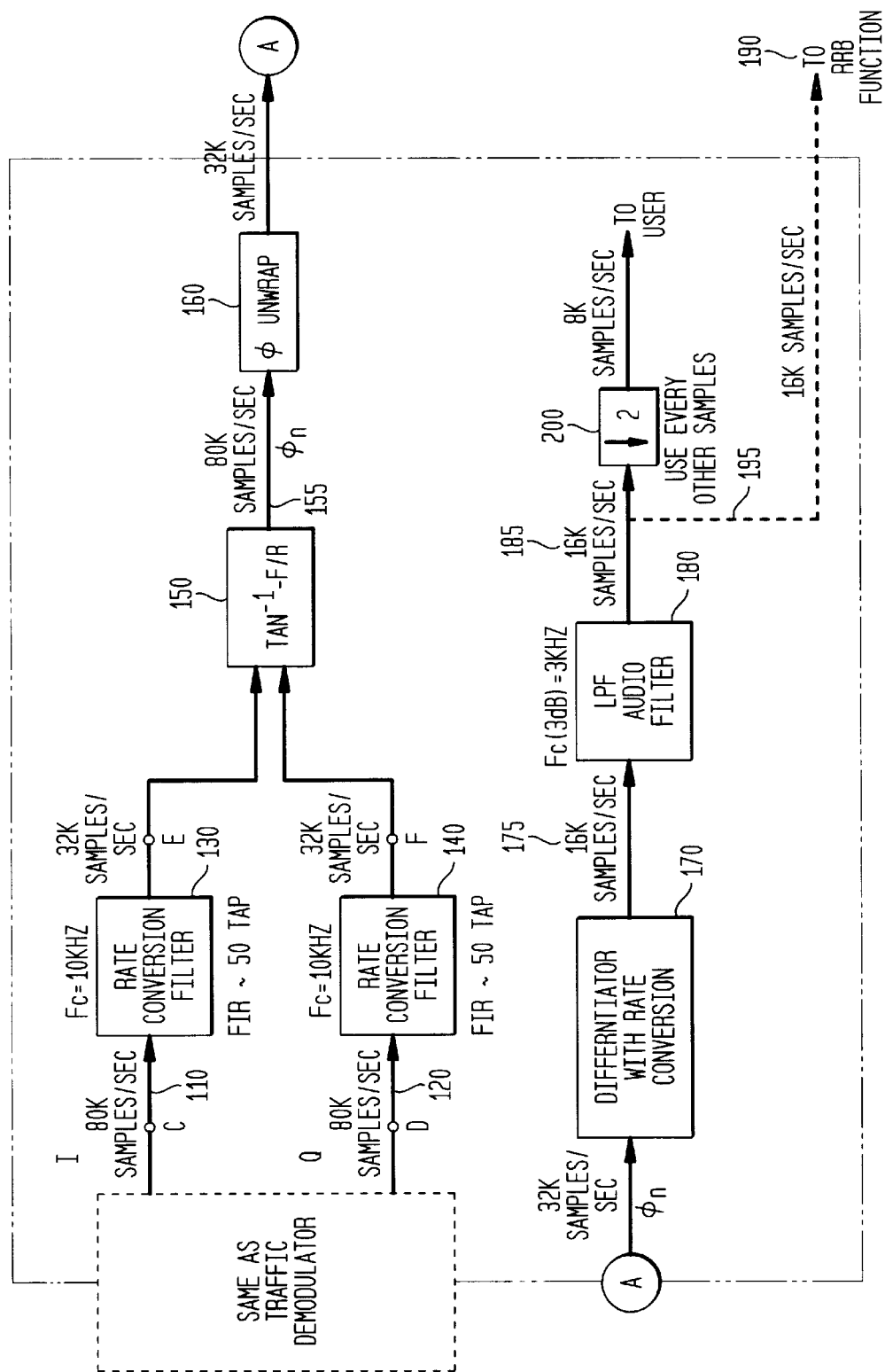
FIG. 10 is a diagram showing the FM voice signal demodulation implementation.

The FM voice demodulation process is depicted in FIG. 10. In the voice signal mode, FSK traffic signal data is replaced with an FM modulated 3 KHz voice signal. As with traffic data, the FM 'carrier' is 40 KHz. The FM voice demodulator 100 has a first stage processing identical to that of the traffic demodulator first stage processing. The processing up to nodes C and D of FIG. 10 are identical to nodes C and D of FIG. 5. Low pass rate conversion filters 130 and 140 having a cutoff of 10 Khz corresponding to the FM voice modulation bandwidth operate on the I and Q signals respectively to remove control energy and convert the I and Q signals to 32 Khz at nodes E and F. The 32 KHz I and Q signals are input to ARCTANGENT module 150. The arctangent function operates on the I and Q signals and is computed 32,000 times/sec to derive a phase signal $\Phi(n)=\arctan(-Q(n)/I(n))$. The arctangent output is limited to the range of (-pi,pi). Therefore the phase signal output from module 150 is input over line 155 to phase module 160 in order to "unwrap" the phase angle, since the total phase can be many multiples of pi. The 32 KS/sec unwrapped phase signal output from module 160 is input to module 170 having a 12 tap low-pass filter and a 20 tap FIR differentiator to permit downsampling or decimation of the phase signal to a 16 KS/sec sample rate. The output of the differentiator 170 is a 16 KS/sec audio signal 175. The audio signal 175 is then input to 34 tap audio filter 180 having a 3 dB frequency of 3 KHz. The filtered audio signal 185 is then input to module 200, where every other sample is selected and output at 8 KHz. The filtered audio signal 185 may also be optionally output at 16 KHz to an external source 190 over line 195 such as to the RRB (Remote Rebroadcast) or retransmit output source.

An estimate has been made of the computational load for FM voice demodulation. Assuming 10 cycles for each interrupt, 8 cycles for the bandshifting filter (differencing), 35 cycles for the 10 KHZ low pass filter 135, 70 cycles for the arctangent module 150, 45 cycles for phase unwrapping module 160, 35 cycles (at 16 KHz) for the combined 32:16 KHz filter and 16:16 KHz differentiator 170 and 35 cycles (at 16 KHz) for the audio filter 180, the computational load is: 160K*(10+8*2/2+35*2/10+115/5+35/10+35/10)=8.8 Mips.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. In a digital communications system for communicating between two radios by transceiving a signal comprising a first type control signal, a second type data traffic signal and a third type voice signal, a remote communication interface for providing transmission therebetween comprising:

means for determining said signal type to be transmitted;

means for modulating said signal for transmission according to said signal type, wherein a corresponding look-up table is associated with each of said first, second, and third type signals for storing modulated samples associated with said corresponding signal types, wherein each particular sample represents a portion of a particular logic zero or one value of said corresponding first, second or third type signal;

means for demodulating said signal for reception according to said signal type;

wherein said communication interface is operable to transceive either said modulated traffic, control, or voice signal, or combined modulated traffic and control signal, or combined modulated voice and control signal.

2. The communication interface of claim 1, wherein said means for modulating said signal includes:

duplexer means for transceiving said signal to a remote radio;

transmit filter means in communication with said duplexer means for low pass filtering said signal for transmission;

analog conversion means in communication with said transmit filter means for sampling said signal at a predetermined frequency and converting said signal to analog format for transmission;

digital signal processing means coupled to said analog conversion means having:
means for modulating said data traffic signal;
means for modulating said control signal; or
means for modulating said voice signal.

3. The communication interface of claim 1, wherein said means for demodulating said signal includes:

receive filter means in communication with duplexer means for low pass filtering said signal for reception;

digital conversion means in communication with said receive filter means for sampling said signal at a predetermined frequency and converting said signal to digital format for reception;

digital signal processing means coupled to said digital conversion means having:
means for demodulating said data traffic signal;
means for demodulating said control signal; or
means for demodulating said voice signal;

means responsive to said digital signal processing means for adjusting the sampling clock rate of said digital conversion means to provide bit alignment and tracing of said signal.

4. The communication interface of claim 2, wherein said means for modulating said data traffic signal includes:

a lookup table having an address associated with each row for storing modulated data traffic signal samples wherein each said sample represents a portion of a particular logic 0 or 1 bit value;

a first base address indicative of an initial location in said lookup table corresponding to said logic 1 bit value;

a second base address indicative of an initial location in said lookup table corresponding to said logic 0 bit value;

an adjustable index for traversing said lookup table;

a pointer responsive to said adjustable index and to said first and second base addresses for outputting the contents of a particular address in said table pointed to by said pointer to said analog conversion means for transmission;

means for adjusting said index in response to succeeding traffic data samples;

means for re-calculating said pointer value responsive to said adjustable index to output the next group of said traffic data samples.

5. The communication interface of claim 4, wherein said row contents of said lookup table for each row r(i) for said logic 0 bit value are given by: SIN(43*m modulo 200*pi/100) and for each row r(j) for said logic 1 bit value are given by: SIN(57*m modulo 200*pi/100) where i=BA0+m, j=BA1+200-m, and where m=value of said adjustable index.

6. The communication interface of claim 4, wherein said modulated data traffic signal is 16 kbps modulated on a 40 KHz carrier signal and having a 45.6 KHz frequency representative of a logic 1 bit value and a 34.4 Khz frequency representative of a logic 0 bit value, and wherein said one logic bit includes ten said traffic signal samples.

7. The communication interface of claim 2, wherein said means for modulating said control signal includes:

a first lookup table having an address associated with each row for storing modulated control signal samples corresponding to a logic 1 bit value and an adjustable index n for traversing said first lookup table;

a second lookup table having an address associated with each row for storing modulated control signal samples corresponding to a logic 0 bit value and an adjustable index m for traversing said second lookup table;

means responsive to said adjustable indices for outputting said stored modulated control signal samples indicative of a particular said logic bit value to said analog conversion means.

8. The communication interface of claim 7, wherein said row contents for each row r(n) of said first lookup table are characterized by:
SIN(4n]*pi/125) where n=index value;

said row contents for each row r(m) of said second lookup table are characterized by:
SIN([m]*pi/125) where m=index value.

9. The communication interface of claim 7, wherein said modulated control signal is 640 kbps modulated on a 40 Khz carrier signal and having a 2.56 Khz frequency representative of said logic 1 bit value and a 3.2 Khz frequency representative of said logic 0 bit value, and wherein said one logic bit includes 250 said control signal samples.

10. The communication interface of claim 2, wherein said means for modulating said voice signal includes:

means for interpolating said voice signal to increase the sample rate of said voice signal;

means for integrating said voice signal samples to obtain an output signal y(n) indicative of the phase of said voice signal;

a lookup table comprising sine and cosine functions and responsive to said output signal y(n) for modulating and interpolating each of said output signal y samples indicative of said voice signal to obtain a modulated voice signal for output to said analog conversion means.

11. The communication interface of claim 10, wherein said interpolation means includes:

a first audio filter stage having a sampling rate of 16 Khz for sampling said voice signal and including a 34 tap finite impulse response (FIR) filter to provide a filtered voice signal;

a second audio filter stage having a 30 tap low pass FIR filter for interpolating said filtered voice signal to a 40 Khz voice signal; and wherein said integration means is a single pole infinite impulse response (IIR) filter.

12. The communication interface of claim 3, wherein said analog conversion means predetermined sampling frequency is 160 Khz, and wherein said digital conversion means predetermined sampling frequency is 160 Khz.

13. The communication interface of claim 3, wherein said means for demodulating said data traffic signal includes:

means for generating I and Q signals indicative of said in-phase and quadrature components of said digitized data traffic signal;

means for rate converting and low pass filtering said I and Q signals to increase said I and Q sample rate and to remove low frequency energy signal components;

phase means responsive to said I and Q signals to provide phase angle values for each bit expressed in arctangent component form having a range of −pi to pi;

unwrap means responsive to said phase means for expanding said phase values to provide said phase angle values in multiples of pi;

tone detection means responsive to said unwrap means and to said I and Q signals for determining whether said received signal includes said data traffic signal or said voice signal;

comparison means operating on said phase angle value differences of said I and Q signal samples to provide an alignment signal for data detection and tracking;

means responsive to said alignment signal to drive alternate phase differences to particular phase values to provide said demodulated data traffic signal, wherein said alternate phase differences represent logic data bit values.

14. The communication interface of claim 3, wherein said means for demodulating said control signal includes:

a summing filter for receiving and summing sequential groups of said control signal samples to provide an output control signal sample sequence having an attenuated spectral energy and a frequency decimated by a factor of two relative to said input control signal samples;

a low pass filter responsive to said output control signal sample sequence for reducing the sample rate of said output control signal sample sequence;

correlation means for correlating groups of said output control signal sample sequence against stored references of control signal data to provide first I1 and Q1 reference signals indicative of a logic 1 bit and second I2 and Q2 reference signals indicative of a logic 0 bit.

energy means for summing the squares of the I1 and Q1 signal references and the I2 and Q2 signal references to produce a first energy reference E1 indicative of said logic 1 bit value and a second energy reference E2 indicative of said logic 0 bit value;

comparison means for comparing the magnitude of said first and second energy references to determine the greater thereof;

detection means responsive to said comparison means for providing an output signal indicative of the greater of said first and second energy references and representative of said determined logic bit value, wherein said logic 1 data bit value is determined when E1 exceeds E2, and said logic 0 data bit value is determined when E1 does not exceed E2.

15. The communication interface of claim 3, wherein said means for demodulating said voice signal includes:

means for generating I and Q signal components indicative of said digitized voice signal;

means for rate converting and low pass filtering said I and Q signals to decrease said I and Q signal sampling rate and to remove low frequency energy signal components;

phase means responsive to said I and Q signals to provide a phase signal having phase angle values for each bit expressed in arctangent component form and having a range of −pi to pi;

unwrap means responsive to said phase means for expanding said phase values to provide said phase angle values in multiples of pi;

a differentiator responsive to said phase signal for decimating the sample rate of said phase signal to provide an output audio signal;

a low pass audio filter responsive to said output audio signal for bandlimiting said audio signal.

16. The communication interface of claim 15, wherein said means for demodulating said voice signal further includes:

sampling means operable on said output audio signal, wherein every other sample of said output audio signal is used to provide a user voice signal.

17. In a digital communications system for communicating between two radios by transceiving a signal comprising a first type control signal, a second type data traffic signal and a third type voice signal, a method for providing a remote communication interface comprising the steps of:

determining said signal type to be transmitted;

modulating said signal for transmission according to said signal type by providing a corresponding lookup table associated with each said first, second, and third type signals for storing data values indicative of samples associated with said corresponding signal types, each said sample represents a portion of a particular logic 0 or 1 bit value;

demodulating said signal for reception according to said signal type;

wherein said communication interface is operable to transceive either said modulated traffic, control, or voice signal, or combined modulated traffic and control signal, or combined modulated voice and control signal.

18. The method of claim 17, wherein the step of modulating said signal includes:

providing a digital signal processor for
  modulating said data traffic signal;
  modulating said control signal; or
  modulating said voice signal;

sampling said signal at a predetermined frequency and converting said signal to analog format for transmission to a remote radio;

low pass filtering said signal to provide to a duplexer; and providing said duplexer for transceiving said signal to said remote radio.

19. The method of claim 17, wherein the step of modulating said signal includes:

providing a digital signal processor for
  modulating said data traffic signal;
modulating said control signal; or
modulating said voice signal;

sampling said signal at a predetermined frequency and converting said signal to analog format for transmission to a remote radio;

low pass filtering said signal to provide to a duplexer; and providing said duplexer for transceiving said signal to said remote radio.

20. The method of claim 19, wherein said sampling of said signal for analog conversion is performed at 160 Khz, and wherein said sampling of said signal for digital conversion is performed at 160 Khz.

21. The method of claim 18, wherein the step of modulating said data traffic signal further includes:

generating a lookup table having an address associated with each row for storing modulated data traffic signal samples wherein each said sample represents a portion of a particular logic 0 or 1 bit value;

generating a first base address indicative of an initial location in said lookup table corresponding to said logic 1 bit value;

generating a second base address indicative of an initial location in said lookup table corresponding to said logic 0 bit value;

generating a pointer responsive to an adjustable index for traversing said lookup table for outputting the contents of a particular table value pointed to by said pointer;

adjusting said index in response to succeeding traffic data samples;

re-calculating said pointer value after adjusting said index to output the next group of said traffic data samples;

providing said data traffic samples indicative of said bit values for conversion to analog format.

22. The method of claim 21, wherein said row contents of said lookup table for each row r(I) for said logic 0 bit value are given by: SIN(43*m modulo 200*pi/100) and for each row r(j) for said logic 1 bit value are given by: SIN(57*m modulo 200*pi/100) where I=BA0+m, j=BA1+200-m, and where m=value of said adjustable index.

23. The method of claim 21, wherein said data traffic signal is 16 kbps modulated on a 40 KHz carrier signal and having a 45.6 KHz frequency representative of a logic 1 bit value and a 34.4 Khz frequency representative of a logic 0 bit value, and wherein said one logic bit includes ten said traffic signal samples.

24. The method of claim 18, wherein the step of modulating said control signal further includes:

generating a first lookup table having an address associated with each row for storing modulated control signal samples corresponding to a logic 1 bit value and an adjustable index n for traversing said first lookup table;

generating a second lookup table having an address associated with each row for storing modulated control signal samples corresponding to a logic 0 bit value and an adjustable index m for traversing said second lookup table;

repeatedly traversing said first and second lookup tables and outputting said stored modulated control signal samples indicative of a particular said logic bit value.

25. The method of claim 24, wherein said row contents for each row r(n) of said first lookup table are characterized by:
SIN(4n *pi/125) where n=index value;
said row contents for each row r(m) of said second lookup table are characterized by:
SIN(m*pi/125) where m=index value.

26. The method of claim 24, wherein said control signal is 640 kbps modulated on a 40 Khz carrier signal and having a 2.56 Khz frequency representative of said logic 1 bit value and a 3.2 Khz frequency representative of said logic 0 bit value, and wherein said one logic bit includes 250 said control signal samples.

27. The method of claim 18, wherein the step of modulating said voice signal further includes:

interpolating said voice signal to increase the sample rate;

integrating said voice signal samples to obtain an output signal y(n) indicative of the phase of said voice signal;

generating a lookup table comprising sine and cosine functions and responsive to said output signal y(n) for modulating and interpolating each of said output signal y(n) samples indicative of said voice signal to obtain a modulated voice signal.

28. The method of claim 19, wherein the step of demodulating said data traffic signal further includes:

generating I and Q signal components indicative of said digitized data traffic signal;

rate converting and low pass filtering said I and Q signals to increase said I and Q sample rates and to remove low frequency energy signal components;

providing I and Q phase angle values for each bit expressed in arctangent component form having a range of −pi to pi;

expanding said phase values to provide said phase angle values in multiples of pi;

comparing said I and Q signals with a predetermined frequency to determine whether said received digital signal includes said data traffic signal or said voice signal;

comparing phase angle value differences of said I and Q signal samples to provide an alignment signal for data detection and tracking;

adjusting said sampling clock in response to said alignment signal to drive alternate phase differences to particular phase values to provide said demodulated data traffic signal, wherein said alternate phase differences represent logic data bit values.

29. The method of claim 19, wherein the step of demodulating said control signal further includes:

receiving and summing sequential groups of four said control signal samples to provide an output control signal sample sequence having an attenuated spectral energy and a frequency decimated by a factor of two relative to said input control signal samples;

filtering said output control signal sample sequence to reduce the sample rate;

correlating groups of said output control signal sample sequence against stored references of control signal data to provide first I1 and Q1 reference signals indicative of a logic 1 bit and second I2 and Q2 reference signals indicative of a logic 0 bit;

summing the squares of the I1 and Q1 signal references and the I2 and Q2 signal references to produce a first energy reference E1 indicative of said logic 1 bit value and a second energy reference E2 indicative of said logic 0 bit value;

comparing the magnitude of said first and second energy references to determine the greater thereof;

providing an output signal indicative of the greater of said first and second energy references and representative of said determined logic bit value, wherein said logic 1 data bit value is determined when E1 exceeds E2, and said logic 0 data bit value is determined when E1 does not exceed E2.

30. The method of claim 29, wherein said stored references include:

a first lookup table indicative of said I1 reference having row contents for each row r(m) characterized by: cos(m*8*pi/25) where m=index value;

a second lookup table indicative of said Q1 reference having row contents for each row r(m) characterized by: sin(m*8*pi/25) where m=index value;

a third lookup table indicative of said I2 reference having row contents for each row r(m) characterized by: cos(m*10*pi/25) where m=index value;

a third lookup table indicative of said Q2 reference having row contents for each row r(m) characterized by: sin(m*10*pi/25) where m=index value.

31. The communication interface of claim 19, wherein the step of demodulating said voice signal includes:

generating I and Q signals indicative of said digitized voice signal;

rate converting and low pass filtering said I and Q signals to decrease the sampling rate and to remove low frequency energy signal components;

providing a phase signal responsive to said I and Q signals having phase angle values for each bit expressed in arctangent component form and having a range of −pi to pi;

expanding said phase values to provide said phase angle values in multiples of pi;

differentiating said phase signal in order to decimate the sample rate to provide an output audio signal;

low pass filtering said output audio signal to bandlimit said output audio signal.

32. The method of claim 31, wherein the step of demodulating said voice signal further includes:

sampling every other sample of said output audio signal to provide a user voice signal.

33. The communication interface of claim 14, wherein said stored references include:

a first lookup table indicative of said I1 reference having row contents for each row r(m) characterized by: cos(m*8*pi/25) where m=index value;

a second lookup table indicative of said Q1 reference having row contents for each row r(m) characterized by: sin(m*8*pi/25) where m=index value;

a third lookup table indicative of said I2 reference having row contents for each row r(m) characterized by: cos(m*10*pi/25) where m=index value;

a third lookup table indicative of said Q2 reference having row contents for each row r(m) characterized by: sin(m*10*pi/25) where m=index value.

* * * * *